United States Patent [19]

Nakayoshi et al.

[11] Patent Number: 5,145,931

[45] Date of Patent: Sep. 8, 1992

[54] SEMICONDUCTOR PELLET ADHESIVE AND ARTICLE MADE THEREWITH

[75] Inventors: Kazumi Nakayoshi; Katsutoshi Mine, both of Chiba, Japan

[73] Assignee: Dow Corning Toray Silicone Company, Ltd., Tokyo, Japan

[21] Appl. No.: 604,843

[22] Filed: Oct. 26, 1990

[30] Foreign Application Priority Data

Nov. 15, 1989 [JP]  Japan .................................. 1-297161

[51] Int. Cl.$^5$ .............................................. C08G 77/06
[52] U.S. Cl. ...................................... 528/15; 524/783; 524/786; 524/862
[58] Field of Search ................. 524/783, 786, 862, 15

[56] References Cited

U.S. PATENT DOCUMENTS 4,721,994  3/1988  Mine et al. ............................. 357/70
4,742,103  5/1988  Morita et al. ......................... 524/174

FOREIGN PATENT DOCUMENTS 5530  1/1986  Japan .

Primary Examiner—Paul J. Thibodeau
Assistant Examiner—D. S. Nakarani
Attorney, Agent, or Firm—Roger H. Borrousch

[57] ABSTRACT

An adhesive for bonding a semiconductor pellet to an attachment site where the adhesive is an addition reaction-curing silicone rubber composition which contain $\leq 500$ ppm of low-molecular-weight siloxane which has a vapor pressure $\geq 10$ mmHg at 200° C.

3 Claims, 1 Drawing Sheet

SEMICONDUCTOR PELLET ADHESIVE AND ARTICLE MADE THEREWITH

1. Technical Field

The present invention relates to an adhesive, and, more particularly, relates to an adhesive (a die bonding agent) for bonding a semiconductor pellet to the material at the semiconductor pellet's attachment site, for example, a tab. This invention, as another embodiment, relates to a semiconductor pellet bonded to a pellet attachment site with the adhesive.

2. Prior Art

Semiconductor devices have a structure, for example, in which a silicon-based semiconductor pellet is bonded by an adhesive (die bonding agent), such as epoxy resin or polyimide resin, to an attachment site/support for the semiconductor pellet, such as a tab. In addition, the semiconductor pellet is electrically connected to a metal lead frame, and this assembly is sealed using a sealing resin such as epoxy resin. A tab and lead frame is described in U.S. Pat. No. 4,721,994, issued Jan. 26, 1988, to Mine et al. Because such a semiconductor device is constituted of various types of materials, cracking may develop in the semiconductor pellet or sealant resin in association with semiconductor pellet warming or heating during sealing with the sealant resin due to the increased internal strain which originates in mechanical stresses and differences in the materials' thermal expansion. This causes changes in the performance of the semiconductor device and thus raises the drawback of a decline in its reliability.

As a particular matter, it has recently become necessary to increase both the degree of integration and mounting density of semiconductor pellets, and internal strain is promoted by the accompanying upscaling of the semiconductor pellet. Moreover, in order to increase the processability and thermal conduction of semiconductor devices, as well as, reduce costs, a trend has developed toward copper alloys (relatively high thermal expansion coefficient) from Ni-Fe alloys (relatively low thermal expansion coefficient) with regard to the material making up the lead frame and semiconductor pellet attachment site (tab, etc.). As a consequence, the aforementioned drawback is increasingly being looked upon as a problem.

Thus, when a large-scale silicon-based semiconductor pellet is fixed on a copper tab using a prior die bonding agent such as epoxy resin adhesive or polyimide resin adhesive, stresses develop due to the difference in thermal expansivity between the copper tab and semiconductor pellet, and the curvature of the semiconductor pellet becomes large. Its properties are altered and in extreme cases cracking develops in the pellet, and the decline in the reliability of the semiconductor device can be even greater than before.

In order to solve this problem, a semiconductor device has already been proposed in which the semiconductor pellet and tab are bonded by a silicone rubber adhesive, refer to Japanese Patent Application Laid Open [Kokai or Unexamined] Number 61-5530 [5,530/86], published Jan. 11, 1986, and assigned to Hitachi Ltd. This attempts to use an elastic silicone rubber to relieve the internal strain originating in the different thermal expansivities of the tab and semiconductor pellet.

PROBLEMS TO BE SOLVED BY THE INVENTION

However, the invention proposed by Hitachi Ltd suffers from several problems. First, after the semiconductor pellet has been bonded to the tab using the silicone rubber, one encounters a reduced bondability between the bonding wires and the semiconductor pellet and between the bonding wires and the lead frame (wire bondability) when the semiconductor pellet and lead frame are connected by bonding wires, for example, gold wire, and this leads to a reduced reliability on the part of the semiconductor device. Moreover, the moisture resistance is reduced due to defective adhesion between the sealant resin and the semiconductor pellet, tab, and lead frame.

SUMMARY OF THE INVENTION

The present inventors conducted extensive research directed at solving the aforementioned problems, and discovered as a result that these problems could be simultaneously solved through the use of a special silicone rubber composition as the die bonding agent. The present invention was achieved based on this finding.

That is, the present invention takes as its object the introduction of an adhesive for bonding a semiconductor pellet to the material at said pellet's attachment site, wherein said adhesive is distinguished by the absence after die bonding of any inhibition of wire bondability and by the absence of any reduction in moisture resistance due to defective adhesion between sealant resin and semiconductor pellet, tab, or lead frame.

MEANS SOLVING THE PROBLEMS AND FUNCTION THEREOF

The present invention relates to an adhesive for bonding a semiconductor pellet to the material at said pellet's attachment site, wherein said adhesive comprises an addition reaction-curing silicone rubber composition which contains $\leq 500$ ppm of low-molecular-weight siloxane which has a vapor pressure $\geq 10$ mmHg at 200° C.

An embodiment of the present invention is an article comprising a semiconductor pellet bonded to a pellet attachment site with an adhesive comprising an addition reaction-curing silicone rubber composition which contains $\leq 500$ ppm of low-molecular-weight siloxane which has a vapor pressure $\geq 10$ mmHg at 200° C.

LIST OF REFERENCE NUMBERS WITH DEFINITIONS

Figure 1:
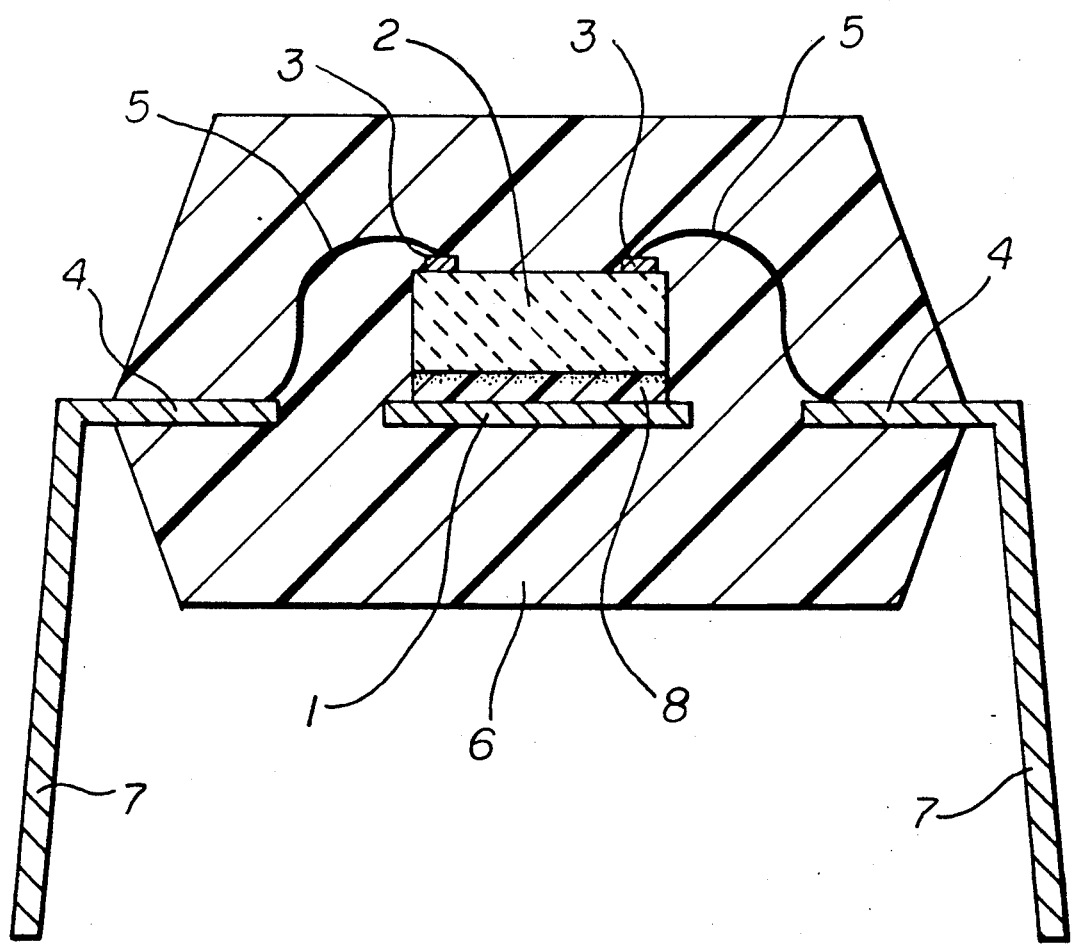
FIG. 1 contains a schematic cross section of the semiconductor device used to evaluate the properties of the adhesive in the examples of the present invention.

1: tab
2: semiconductor pellet
3: aluminum bonding pad
4: copper inner lead frame
5: gold wire
6: epoxy resin
7: copper outer lead frame
8: adhesive

DESCRIPTION OF THE PREFERRED EMBODIMENTS

To explain the preceding in greater detail, the main components of the addition reaction-curing silicone rubber composition used by the present invention are organopolysiloxane having silicon-bonded alkenyl groups, SiH-containing organopolysiloxane, and hydrosilylation reaction catalyst, and this composition should be able to form a rubbery elastic silicone rubber by curing at room temperature or with heating. Within the context of the present invention, it is essential that this addition reaction-curing silicone rubber composition contain $\leq 500$ ppm of low-molecular-weight siloxane having a vapor pressure $\geq 10$ mmHg at 200° C. Both the wire bondability and the moisture resistance are reduced when the content of such low-molecular-weight siloxane exceeds 500 ppm. This low-molecular-siloxane may be linear or cyclic, and is exemplified by cyclic siloxane as represented by the following formula

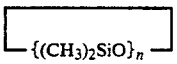

in the preceding formula, n is an integer with a value of 3 to 25 and by linear siloxane as represented by the following formula $$(CH_3)_3SiO\{(CH_3)_2SiO\}_mSi(CH_3)_3$$

in the preceding formula, m is an integer with a value of 1 to 25. The content of this low-molecular-weight siloxane can be easily determined by extracting the low-molecular-weight siloxane from the organopolysiloxane or silicone rubber composition using organic solvent and analyzing the extracted amount by gas chromatography. This can also be measured by gas chromatographic analysis of the gases developed when the organopolysiloxane composition is heated.

The adhesive of the present invention preferably consists of the following addition reaction-curing silicone rubber composition:

(A) 100 parts by weight organopolysiloxane which has at least two silicon-bonded alkenyl groups in each molecule and which contains $\leq 500$ ppm of low-molecular-weight siloxane with a vapor pressure $\geq 10$ mmHg at 200° C., (B) organohydrogenpolysiloxane having at least two silicon-bonded hydrogen atoms in each molecule, in a quantity such that this component furnishes 0.5 to 3 silicon-bonded hydrogen atoms per 1 silicon-bonded alkenyl group in component (A), (C) 0 to 10 weight parts organosilicon compound which contains a functional group as represented by $-Si O R^1$ in the preceding formula, $R^1$ is a monovalent hydrocarbon group and which also contains the silicon-bonded lower alkenyl group or silicon-bonded hydrogen atom, (D) a catalytic quantity of a platinum-type catalyst, and (E) 0 to 400 parts by weight filler.

The organopolysiloxane having silicon-bonded alkenyl groups, component (A), consists of organopolysiloxane which has at least two silicon-bonded alkenyl groups in each molecule and which is represented by the following average unit formula $$R^2{}_aSiO_{(4-a)/2}$$

in the preceding formula, $R^2$ is a monovalent hydrocarbon group as illustrated by alkyl groups such as methyl, ethyl, propyl, and so forth, aryl groups such as phenyl, tolyl, and so forth, alkenyl groups such as vinyl, allyl, propenyl, hexenyl, and so forth; and a has a value of 1 to 3.

While this organopolysiloxane can be prepared by those methods known to the individual skilled in the art, this will in general contain as a by-product approximately 2 to 7 weight % low-molecular-weight siloxane having a vapor pressure $\geq 10$ mmHg at 200° C., such as octamethyltetracyclosiloxane, decamethylpentacyclosiloxane, dodecamethylhexacyclosiloxane, and so forth.

Organopolysiloxane which contains $\leq 500$ ppm low-molecular-weight siloxane with a vapor pressure $\geq 10$ mmHg at 200° C. comprising component (A) used by the present invention can be prepared by removing this low-molecular-weight siloxane from the aforementioned organopolysiloxane, and numerous methods are available for this removal of low-molecular-weight siloxane. For example, usable methods include, inter alia, conversion of the organopolysiloxane into a thin film and stripping at 180° to 300° C. in a vacuum ($\leq 0.5$ mmHg), but also extraction of the low-molecular-weight siloxane by the addition to the organopolysiloxane of a solvent such as methanol, ethanol, propanol, butanol, or acetone.

As a general matter, the organopolysiloxane comprising component (A) should have a viscosity within the range of 50 to 500,000 centistokes at 25° C., while viscosities within the range of 400 to 100,000 centistokes are particularly suitable.

The organohydrogenpolysiloxane comprising component (B) is a crosslinker for component (A), and should contain at least 2 silicon-bonded hydrogen atoms in each molecule. Its molecular structure may be any of linear, branched, or cyclic.

This organohydrogenpolysiloxane should be admixed in a quantity sufficient for this component to furnish 0.5 to 3 silicon-bonded hydrogen atoms per alkenyl group in component (A). Quantities sufficient to provide 1 to 2 silicon-bonded hydrogen atoms are preferred. This quantity generally will not exceed 2 weight % of component (A). Furthermore, in order that component (B) contain low-molecular-weight siloxane comparable with component (A), the use is preferred of a component (B) from which the low-molecular-weight siloxane by-product has been removed, for example, by stripping at 180° to 300° C. in a vacuum $\geq 0.5$ mmHg.

The organohydrogenpolysiloxane under consideration is exemplified as follows.

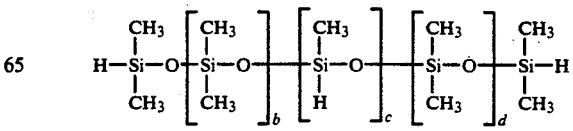

-continued

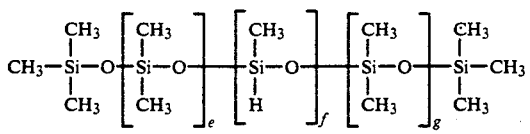

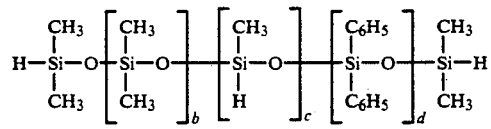

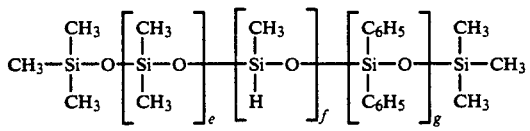

in the preceding formulas, b, c, d, e, and g are zero or a positive integer and f is an integer with a value of at least 2.

Component (C) imparts adhesiveness to the adhesive of the present invention, and it comprises an organosilicon compound which contains the functional group represented by -SiOR1 in which R1=monovalent hydrocarbon group such as methyl, ethyl, propyl, propenyl, etc. and which also contains the lower alkenyl group or silicon-bonded hydrogen atom. Concrete examples of this organosilicon compound are as follows.

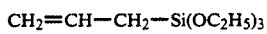

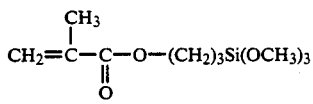

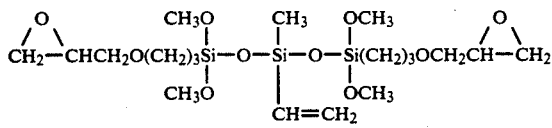

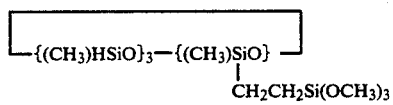

The quantity of addition for component (C) should fall within the range of 0 to 10 parts by weight and preferably 0.5 to 3.0 parts by weight per 100 parts by weight component (A).

The filler comprising component (E) is added in order to impart an appropriate hardness, strength, and workability to the adhesive of the present invention, and generally comprises those fillers used in addition reaction-curing silicone rubber compositions. Such fillers are exemplified by fumed silica, precipitated silica, hydrophobicized silica, titanium dioxide, carbon black, alumina, powdered quartz, and so forth.

The quantity of addition for the filler of component (E) may be freely selected as long as the object of the invention is not hindered, and as a general matter is designated as not in excess of 400 weight parts per 100 parts by weight component (A).

The platinum-type catalyst comprising component (D) is a catalyst for curing the adhesive of the present invention, and usable in this regard are those generally known as addition-reaction catalysts. Examples are platinum black, solid platinum supported on a carrier such as alumina or silica, chloroplatinic acid, alcohol-modified chloroplatinic acid, olefin/chloroplatinic acid complexes, and platinum/vinylsiloxane complexes. On the subject of the use of these catalysts, the solid catalysts should be sufficiently finely ground, or the particle size of their supports should be small enough, to give good dispersibility, and large specific surface areas are preferred. Chloroplatinic acid and its complexes with olefin are advantageously used by dissolving them in a solvent such as alcohol, ketone, ether, or hydrocarbon. The quantity of addition of such catalysts should be suitably adjusted so as to afford the desired curing rate. However, with regard to those catalysts compatible with siloxane, such as chloroplatinic acid and so forth, a range of 1 to 100 ppm as platinum referred to the total quantity of components (A) and (B) is preferred for obtaining a good cured product.

The present invention is explained in greater detail with reference to the following illustrative examples. The viscosity reported in the examples was measured at 25° C. and the parts are parts by weight unless otherwise specified.

The content of low-molecular-weight siloxane and the properties of the adhesive were measured according to the following methods.

Measurement of Low-Molecular-Weight Siloxane Content

The low-molecular-weight siloxane was extracted with acetone from the starting organopolysiloxane, and the amount extracted was measured by gas chromatography with flame ionization detector (FID).

Evaluation of Semiconductor Pellet Cracking

Adhesive 8 was placed between semiconductor pellet 2 and tab 1 and heated for 1 minute at 200° C. After cooling the obtained unified assembly comprising semiconductor pellet 2 and tab 1 bonded via adhesive 8, the surface of the semiconductor pellet 2 was evaluated under a microscope.

Evaluation of the Wire Bondability

The aluminum pads 3 on the assembly afforded by the preceding evaluation of semiconductor pellet cracking were bonded to a copper lead frame 4 by gold wires 5 (wire bonding) to give another unified assembly. The gold wires 5 were bonded by ultrasonic hot-press bonding. The bonding points between the gold wires 5 and aluminum pads 3 and between the gold wires 5 and lead frame 4 in this assembly were then inspected. The gold wires 5 were pulled on at the same time, and defective bonding was scored when a gold wire 5 could be lifted up. The number of defective bondings is reported referred to the total number of tested bondings.

Evaluation of Moisture Resistance

The unified assembly obtained in the aforementioned evaluation of wire bondability was sealed with epoxy resin 6 in order to manufacture a semiconductor device. This semiconductor device was then heated for the specified time in saturated steam (2 atm, 121° C.). After heating, current was applied to the semiconductor device, and the leakage current across the copper inner frame 4 was measured. The semiconductor device was scored as defective in the case of an increased leakage current and pass-thru defect. The number of defects is reported relative to the total number of semiconductor devices.

REFERENCE EXAMPLE 1

Disiloxane with the following formula

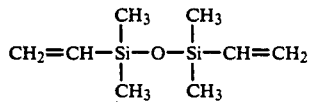

and cyclic siloxane with the following formula

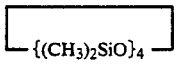

were polymerized using potassium silanolate catalyst, and a vinyl group-containing dimethylpolysiloxane (I) was obtained by neutralization.

This vinyl group-containing dimethylpolysiloxane (I) was stripped for 5 hours at 10 mmHg/180° C. in order to remove low-molecular-weight siloxane, and vinyl group-containing dimethylpolysiloxane (II) with a viscosity of 2,000 centistokes was obtained.

The quantities of low-molecular-weight siloxane contained in these dimethylpolysiloxanes (I) and (II) were determined by gas chromatography (GC-9A from Shimadzu Seisakujo, FID): its content in dimethylpolysiloxane (I) was 20.5 weight % and its content in dimethylpolysiloxane (II) was 1.3 weight %, and the main component of the low-molecular-weight siloxane with vapor pressure $\geq$ 10 mmHg at 200° C. was the cyclic dimethylpolysiloxane decamer ($D_{10}$).

Dimethylpolysiloxane (II) was additionally subjected to molecular distillation for 8 hours at 260° C./0.01 mmHg in order to remove the low-molecular-weight siloxane. The content of low-molecular-weight siloxane to the decamer ($D_{10}$) in the obtained vinyl group-containing dimethylpolysiloxane (III) was 0.01 weight %.

100 Parts dimethylpolysiloxane (III) and 300 parts ethanol were then stirred together for 3 hours, and the ethanol was separated after standing. This same ethanol extraction process was then repeated four times in order to remove the low-molecular-weight siloxane. The ethanol fraction in this dimethylpolysiloxane was removed by stripping for 5 hours at 180° C./10 mmHg. The content of low-molecular-weight siloxane to the decamer ($D_{10}$) in the obtained vinyl group-containing dimethylpolysiloxane (IV) was 10 ppm.

REFERENCE EXAMPLE 2

65 Parts of the vinyl group-containing dimethylpolysiloxane (III) prepared in Reference Example 1 was mixed with 35 parts copolymer (vinyl group content=25 mole %) composed of the $SiO_2$ units, $(CH_3)_3SiO_{\frac{1}{2}}$ units, and $(CH_3)_2(CH_2=CH)SiO_{\frac{1}{2}}$ unit. 100 Parts of this mixture and 300 parts ethanol were stirred together for 3 hours, and the ethanol was separated after standing. This same ethanol extraction process was then repeated 4 times in order to remove low-molecular-weight siloxane. The ethanol in this dimethylpolysiloxane was removed by stripping for 5 hours at 180° C./mmHg to afford a vinyl-containing dimethylpolysiloxane resin (V) having a viscosity of 9,000 centistokes. This dimethylpolysiloxane resin (V) contained 10 ppm low-molecular-weight siloxane to the decamer ($D_{10}$).

REFERENCE EXAMPLE 3

Disiloxane with the following formula

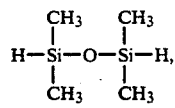

cyclic siloxane with the following formula

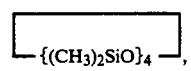

and cyclic siloxane with the following formula

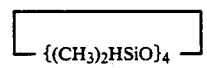

were polymerized in the presence of sulfuric acid catalyst, and neutralization afforded the SiH-containing polysiloxane (VI) with the following average compositional formula.

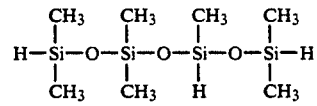

This polysiloxane (VI) was stripped for 3 hours at 180° C. under a 0.5 mmHg vacuum to give SiH-containing polysiloxane (VII) with a reduced content of low-molecular-weight siloxane. The content of low-molecular-weight siloxane to the decamer ($D_{10}$) in polysiloxanes (VI) and (VII) was 17.0 weight % in (VI) and 100 ppm in (VII).

EXAMPLE 1

100 Parts vinyl-containing polysiloxane (IV) as prepared in Reference Example 1, 10 parts hydrophobicized fumed silica with a specific surface area of 200 m2/g, 1.5 parts SiH-containing polysiloxane (VII) as prepared in Reference Example 3, and chloroplatinic acid/olefin complex sufficient to give 5 ppm platinum were mixed to homogeneity to give an addition reaction-curing silicone rubber adhesive composition. This composition contained 10 ppm low-molecular-weight siloxane. The volatile component developed upon curing this composition (200° C./10 minutes) was measured by gas chromatography at 156 ppm. This composition was then used as a die bonding agent in semiconductor device production, and its pellet cracking, wire bondability, and moisture resistance were measured. These results are reported in Table 1.

COMPARISON EXAMPLE

An addition reaction-curing silicone rubber adhesive composition was prepared proceeding as in Example 1 with the following modifications: vinyl-containing dimethylpolysiloxane (II) was used in place of vinyl-containing dimethylpolysiloxane (IV) in Example 1, and SiH-containing polysiloxane (VI) was used in place of the SiH-containing polysiloxane (VII) prepared in Reference Example 3. This composition contained 13,900 ppm low-molecular-weight siloxane. The volatile component developed upon curing this composition (200° C./10 minutes) was measured by gas chromatography at 32,600 ppm. This composition was then used as a die bonding agent in semiconductor device production, and its semiconductor pellet cracking, wire bondability, and moisture resistance were measured as in Example 1. These results are also reported in Table 1.

TABLE 1

|  | PRESENT INVENTION | COMPARISON EXAMPLE |
|---|---|---|
| Outer lead frame count | 16 pin | 16 pin |
| Semiconductor pellet size (mm × mm) | 13.5 × 4.5 | 13.5 × 4.5 |
| Number of test specimens (IC) | 30 | 30 |
| Presence/absence of semiconductor pellet cracking | absent | absent |
| Proportion of wire bonding defects | 0/480 | 38/480 |
| Proportion of moisture resistance defects: | | |
| after 48 hours | 0/30 | 2/30 |
| after 168 hours | 0/30 | 8/30 |
| after 504 hours | 0/30 | 17/30 |

EXAMPLE 2

100 Parts vinyl-containing dimethylpolysiloxane (V) as prepared in Reference Example 2, 50 parts crystalline silica, 2.5 parts SiH-containing polysiloxane (VII) as prepared in Reference Example 3, 1.0 part organosilicon compound with the following formula functioning as adhesion promoter,

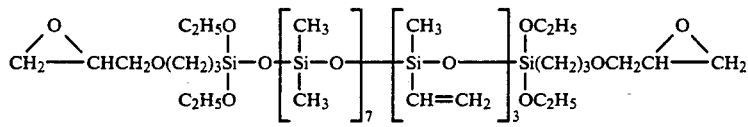

and chloroplatinic acid/methylvinylsiloxane dimer complex sufficient to give 5 ppm platinum were mixed to homogeneity to give an addition reaction-curing silicone rubber adhesive composition. This composition contained 10 ppm low-molecular-weight siloxane according to measurement as in Example 1. The volatile component evolved when this composition was cured (200° C./minutes) was measured by gas chromatography at 102 ppm. A semiconductor device was then manufactured using this composition as the die bonding agent, and its pellet cracking, wire bondability, and moisture resistance were measured. No defects were found, and these results are reported in Table 2.

TABLE 2

| Outer lead frame count | 64 pin |
|---|---|
| Semiconductor pellet size (mm × mm) | 10.0 × 10.0 |
| Number of test specimens (IC) | 30 |
| Proportion of wire bonding defects | 0/1920 |
| Proportion of moisture resistance defects: | |
| after 48 hours | 0/30 |
| after 168 hours | 0/30 |
| after 504 hours | 0/30 |

EFFECTS OF THE INVENTION

The adhesive according to the present invention consists of an addition reaction-curing silicone rubber composition which contains ≦500 ppm of low-molecular-weight siloxane with a vapor pressure ≧10 mmHg at 200° C. Accordingly, when used as an adhesive for bonding a semiconductor pellet to the material at said pellet's attachment site (die bonding agent), in contrast to conventional addition reaction-curing silicone rubber compositions there is no reduction in wire bondability, no reduction in adhesiveness between sealant resin and semiconductor pellet surface or lead frame, and no reduction in the semiconductor device's moisture resistance. Furthermore, with regard to the bonding of the semiconductor pellet and lead frame, with their different thermal expansion coefficients, into a single element, this adhesive is distinguished by its ability to reduce changes in the properties of the semiconductor and to prevent cracking and bending of the semiconductor pellet, which derive from its capacity to absorb and reduce the stresses which develop between these two components.

That which is claimed is:

1. An adhesive for bonding a semiconductor pellet to the material at said pellet's attachment site, wherein said adhesive comprises an addition reaction-curing silicone rubber composition which contains ≦500 ppm of low-molecular-weight siloxane which has a vapor pressure ≧10 mmHg at 200° C.

2. The adhesive according to claim 1 in which the addition reaction-curing silicone rubber composition consists of
(A) 100 parts by weight organopolysiloxane which has at least two silicon-bonded alkenyl groups in each molecule and which contains ≦500 ppm low-molecular-weight siloxane with a vapor pressure ≧10 mmHg at 200° Centigrade,
(B) organohydrogenpolysiloxane having at least two silicon-bonded hydrogen atoms in each molecule, in a quantity such that this component furnishes 0.5 to 3 silicon-bonded hydrogen atoms per 1 alkenyl group in component (A),
(C) 0 to 10 parts by weight of an organosilicon compound which contains a functional group as represented by —SiOR$^1$ in which R$^1$ is a monovalent hydrocarbon group and which also contains the silicon-bonded lower alkenyl group or silicon-bonded hydrogen atom,
(D) a catalytic quantity of a platinum-type catalyst, and
(E) 0 to 400 weight parts filler.

3. The adhesive according to claim 2 in which (C) is present in an amount of from 0.5 to 3 parts by weight.

* * * * *